United States Patent
Kim et al.

(10) Patent No.: US 6,630,873 B2
(45) Date of Patent: *Oct. 7, 2003

(54) MAGNETOSTATIC WAVE FILTER

(75) Inventors: Meyng-Soo Kim, Taejon (KR);
Dong-Young Kim, Taejon (KR);
Sang-Seok Lee, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/871,761

(22) Filed: May 31, 2001

(65) Prior Publication Data

US 2002/0075103 A1 Jun. 20, 2002

(30) Foreign Application Priority Data

Dec. 19, 2000 (KR) ......................................... 2000-78262

(51) Int. Cl.$^7$ .............................. H03H 9/22; H01P 1/20
(52) U.S. Cl. ..................... 333/148; 333/202; 333/219.2
(58) Field of Search ............................... 333/202, 219.2, 333/201, 204, 158, 148, 195, 149

(56) References Cited

U.S. PATENT DOCUMENTS

| | | | |
|---|---|---|---|
| 4,199,737 A | | 4/1980 | Patterson et al. ............ 333/154 |
| 4,571,562 A | * | 2/1986 | Castera ........................ 333/186 |
| 4,983,937 A | | 1/1991 | Kinoshita et al. ............ 333/202 |
| 5,168,254 A | * | 12/1992 | Ito et al. ..................... 333/219.2 |
| 5,663,698 A | | 9/1997 | Okada et al. ................ 333/202 |
| 6,356,165 B1 | * | 3/2002 | Kim et al. .................... 333/148 |

OTHER PUBLICATIONS

Omori, T. et al., "A Study on Magnetostatic Surface Wave Excitation by Microstrip," *IEICE Trans. Electron.*, E77–C(2):312–318, 1994.

Koike, T. et al., "A New Method for Controlling Resonant Frequencies for Straightedge MSW Resonators," in *Proceedings of the IEEE Ultrasonic Symposium*, Department of Electronic Engineering, Tamagawa University, Machida, Tokyo, 1994, pp. 781–784.

\* cited by examiner

Primary Examiner—Robert Pascal
Assistant Examiner—Dean Takaoka
(74) *Attorney, Agent, or Firm*—Seed IP Law Group PLLC

(57) ABSTRACT

A magnetostatic wave filter that includes a ferromagnetic substance stacked on one side of a dielectric substrate, one side of which is grounded, and the filter includes an input section having an input transfer line and an input energy transformer for causing the energy transformation between an electromagnetic wave and a magnetostatic wave, and an output section having an output energy transformer for causing the energy transformation between the electromagnetic wave and the magnetostatic wave and an output transfer line. The width of exciting lines in the input energy transformer and the output energy transformer varies in a longitudinal direction, the filter includes a shield film formed of a grounded conductive film having holes through which a magnetic thin film can pass between the input section and said output section, to prevent coupling of an electromagnetic wave.

20 Claims, 12 Drawing Sheets

MAGNETOSTATIC WAVE FILTER

TECHNICAL FIELD

The invention relates generally to a magnetostatic wave filter. More particularly, the invention relates to a magnetostatic wave filter capable of controlling the property of flatness and the width of the band-pass that are characteristics within a transfer band of a filter, by adjusting the pattern shape of a transformation section in input and output section.

BACKGROUND OF THE INVENTION

In a conventional magnetostatic wave filter, the distance between a line and its neighboring line is constant in the longitudinal direction of the line even when a line having the constant size or multiple lines are used with various shapes of input/output electrodes. Also, a A structure having a magnetic thin film at one side is used. Therefore, there are problems that the band-pass width of the filter is narrow and a band-pass ripple occurs severely.

In addition, in order to expand the band-pass width and reduce the ripple, the thickness of a ferromagnetic thin film must be increased, thus resulting high manufacturing cost.

Also, as there is not used a metal shield film for electrically isolating an input and an output in a flat structure, the coupling of the input and the output occurs outside the pass frequency band. Thus, there is a problem that the attenuation rate of the magnetostatic wave filter is poor.

Prior references relating to conventional magnetostatic wave filters for overcoming these problems are now explained.

First, there is U.S. Pat. No. 5,663,698, issued to 'Japan Murata', invented by 'Takekazu Okada, Satoru Kanaya and Shinichiro Ichiguchi' and entitled 'Magnetostatic Wave Device having Slanted End Portions'.

In order to implement a miniature and low-cost magnetostatic wave filter, the prior patent implements the filter by cutting the ends of a YIG (yttrium, iron, garnet) thin film (the YIG thin film grown on a GGG substrate, see "120" shown in FIG. 1) formed on transducers at a constant angle or by putting absorbers on the surface of which is rugged and having a large loss at an end portion of the YIG thin film in order to terminate magnetostatic waves. Therefore, it can reduce the usage of magnetic thin films and accomplish miniaturization, thus resulting a low cost magnetostatic wave filter.

Examining particularly the structure of this prior patent, transducers are formed on a dielectric substrate, having the electrode patterns having the same widths and are constituted by a single line. The end portion of the YIG thin film is slanted (see "128a" and "128b" shown in FIG. 1) or has absorbers on it. Also, the YIG thin film is located at one side of the GGG (gadolinium, gallium, garnet) substrate, and the end portion of the YIG thin film is slanted or has absorbers on it, thus reducing the amount reflected from the end portion of the YIG thin film.

There is another U.S. Pat. No. 4,983,937, issued to 'Japan Hitach', invented by 'Yasnaki Kinoshita, Sadami Kubota and Shigern Takeda' and entitled 'Magnetostatic Wave Band-Pass Filer'.

The prior patent relates to the field of a magnetostatic wave filter in which a signal processing filter for processing a high frequency signal such as a high frequency device is implemented using magnetostatic waves. The magnetostatic wave filter has a magnetostatic filter formed by using a plurality of resonators and a photolithography technology, so that a good frequency response characteristic and a good reappearance can be provided and it is suited for mass production.

In order to accomplish this object, after a YIG film is grown on a GGG substrate, an input/output electrode pattern is formed on the surface of the YIG film or the rear surface of the GGG substrate, using an etching technology. If a high frequency signal is incident to the magnetized YIG film, magnetostatic waves are excited. The excited magnetostatic waves are reflected from the end portion of the YIG film and the reflected waves produce standing waves between both ends of the YIG film, so that the YIG film is resonated by the standing waves. Therefore, if the output electrode is formed in the film parallel to the end portion of the YIG film, high frequency components excited by means of the magnetostatic waves are outputted. At this time, the input/output electrodes may be formed not of a single line but a plurality of electrodes.

In other words, the prior patent has transducers formed on the YIG film or the GGG substrate, transducer electrode patterns having the same widths, the transducer longitudinal direction parallel to the YIG longitudinal direction, and the input/output electrodes made of a plurality of lines, not a single line.

If a filter is manufactured using the technology, proposed in the prior patent, it could obtain a good frequency response characteristic and a good reappearance and is also suited for a mass production.

Further, there is U.S. Pat. No. 4,199,737, issued to 'US Westing house', invented by 'Ralph W. Patterson, Terence W. O'keeffe and John D. Adam' and entitled 'Magnetostatic Wave Device'.

In order to provide a magnetostatic wave filter capable of processing a signal in a high frequency region (in the region of about 20 GHz) and having a low loss and that can be manufactured by a photolithography method, structure is proposed for designing transducers having various shapes and for exciting magnetostatic waves. Thus, it can reduce reflection of a magnetostatic wave at a desired frequency and can design a filter having a relatively narrow bandwidth.

In other words, the transducer has transducer electrode patterns with the same width. The transducer is weighed so that the length of the transducer can be varied and two transducers are paired to reduce reflection in ½ wavelength. Also, the YIG thin film is located at one side of the GGG substrate.

Also, there is an article published in 'Ultrasonics Symposium' (written by 'Takuro Koike and Hiroaki Nakazawa', 1994) entitled 'A new method for controlling Resonant frequencies of Straightedge MSW resonators'.

In the article, when the bandwidth required in a microwave frequency is narrow, it proposes a method of controlling the frequency in a line-shape magnetostatic wave resonator. In order to accomplish this object, the transducer has transducer electrode patterns with the same widths. It further includes a PIN diode serially connected to an end of the transducer and has a line-shape transducer. Also, the YIG thin film is located at one side of the GGG substrate.

In addition, there is an article published in 'IEICE Trans ELECTRON.'(Vol. E77-C, No.2) ('Yatsuya Omori, K. Yashiro and Sumio Ohkawa') entitled 'A study on magnetostatic surface wave excitation by Microstrip'.

The above article proposes a method by which the current density and the radiating resistance in the transducer are calculated, thus implementing a magnetostatic wave filter capable of processing signals in a microwave frequency.

In order to accomplish these objects, it calculates the radiating resistance of the transducer by predicting the current distribution by interpreting the distribution of the electric field in the transducer in a single line using a TE mode and by then predicting the flow of current. When a filter is constituted using a magnetostatic wave, the results are used to design the transducer so that the impedance match can be made well.

In the above mentioned conventional magnetostatic wave filters, an input/output is formed on a magnetically active ferromagnetic thin film that is formed on a magnetically inactive dielectric substrate, or after forming an input/output electrode on a magnetically inactive dielectric substrate, a ferromagnetic thin film is located on it. Therefore, an external magnetic field is applied to the central frequency to implement the function of the filter through transformation and propagation of energy. Also, the shape of the conventional input/output electrode has the shape connected by a line in which the size of the exciting line is uniform. In addition, even when multiple lines are used, the distance between the line and its neighboring line is constant in the longitudinal direction of the line. As such, because the prior devices do not consider variations in the wavelengths per frequencies in the pass frequency bandwidth of a desired filter, there is a problem that a ripple is severely occurs in the characteristic within the pass-band of the filter.

In addition, the prior devices use a structure in which a ferromagnetic thin film is formed at one side of a magnetically inactive substrate and do not use a metal shield film for electrically separating an input section and an output section in a flat structure. Therefore, there is a problem that transfer of energy occurs since coupling of the input section and the output section occurs outside of the pass frequency band.

An exemplary conventional magnetostatic wave filter will be now explained with reference to FIGS. 1 and 2.

FIG. 1 is a plane view showing a structure of a conventional magnetostatic wave filter and FIG. 2 is a front view showing a structure of the magnetostatic wave filter shown in FIG. 1.

The conventional magnetostatic wave filter includes an input transfer line 116a and an output transfer line 116b, both of which have the constant line widths, formed on the other side of a dielectric substrate 180, one side 190 of which is grounded, an input energy transformer 117a comprised of a plurality of straight lines having the line widths for producing the energy transformation of an electromagnetic wave and a magnetostatic wave, the distance between neighboring lines is uniform, and a magnetically active ferromagnet 124 formed on a magnetically inactive substrate 123.

An external DC magnetic field having the intensity higher than saturation susceptibility of a ferromagnetic substance is applied to the conventional magnetostatic wave filter in an adequate direction, so that a magnetically active ferromagnet can be completely saturated. Thus, if an electromagnetic wave of a frequency band by which the saturated ferromagnetic substance can absorb is transferred to the energy transformer 117a, an electromagnetic wave is magnetically coupled in the energy transformer 117a to produce a magnetostatic wave. At this time, after the produced magnetostatic wave is propagated at a certain length by the medium of the magnetized ferromagnetic substance, they are inversely transformed in the output transformer so that transfer of energy is caused.

Referring now to FIG. 3, a line structure of an input energy transformer 117a and an output energy transformer 117b, used in the conventional magnetostatic wave filter will be now explained.

The energy transformation line of the electromagnetic wave and the magnetostatic wave in FIG. 3 is implemented using a single line having a uniform width in the direction along which current flows. The drawing shows a transformer in which a number of lines are consecutively arranged by given distances g1 and g2. The reason for using these transforming lines is for selecting a specific one frequency and is advantageous in obtaining a narrow band-pass transfer characteristic. However, there is a problem that the transferred band-pass is crouched because efficiency to select all of the given frequency band-pass is degraded.

Also, as the shield film for preventing an electromagnetic coupling between the input section and the output section in FIG. 1 does not exist in the middle of the propagation passage, the transfer of energy due to the coupling of an electromagnetic wave in the region in which the magnetostatic wave is generated and other regions in which the magnetostatic wave is not generated and the propagation of energy due to transfer of the magnetostatic wave occurs together. Thus, the value outside the transfer band is significantly increased, to thereby degrade the frequency selectivity of the magnetostatic wave filter.

SUMMARY OF THE INVENTION

The disclosed embodiments of the present invention increase the transfer frequency bandwidth of a magnetostatic wave filter and reduce a ripple effect by applying a line shape in which the width of an exciting line varies in a longitudinal direction and a line shape in which the distance between neighboring lines varies in the longitudinal direction when multiple lines are used to an input electrode and an output electrode, respectively.

Further, the disclosed embodiments of the present invention reduce the coupling between an input section and an output section along the propagation length of the shield film by inserting a ground shield film through which only multiple ferromagnetic thin film can pass the magnetostatic waves between the input section and the output section and to also reduce loss of energy within the band-pass by reflecting the energy toward an opposite direction passing through a transducer using a magnetostatic wave reflector.

In order to accomplish the foregoing, a magnetostatic wave filter having a ferromagnetic substance stacked on one side of a dielectric substrate, one side of which is grounded, is provided. The filter includes an input section having an input transfer line and an input energy transformer for causing the energy transformation of an electromagnetic wave and a A magnetostatic wave, and an output section having an output energy transformer for causing the energy transformation of the electromagnetic wave and the magneto static wave and an output transfer line, on the ferromagnetic substance. The width of exciting lines in the input energy transformer and the output energy transformer varies in dimension along a longitudinal direction. The filter further includes a shield film formed of a grounded conductive film having holes through which a magnetic thin film can pass between the input section and the output section, for preventing coupling of an electromagnetic wave of the input section and the output section.

Also, according to another embodiment of the present invention, there is provided a magnetostatic wave filter including an input section and an output section. The input section includes an input transfer line for performing a transfer line function of an electromagnetic wave energy, and an input energy transformer (transducer) consisting of a single line or multiple lines, the width of the line changing in a horizontal direction in order to transform the energy between an electromagnetic wave and a magnetostatic wave using a signal received from the input transfer line. Also, the output section includes an output energy transformer consisting of a single line or multiple lines, the width of the line changing in a horizontal direction in order to transform the energy between an electromagnetic wave and a magnetostatic wave, and an output transfer line for receiving the transformed electromagnetic wave from the output energy transformer to perform a transfer line function. The filter further includes a shield film formed of a grounded conductive film having holes through which a magnetic thin film can pass between the input section and the output section, for preventing coupling of an electromagnetic wave of the input section and the output section.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

The present invention will be described in detail by way of a preferred embodiment with reference to accompanying drawings.

Figure 4:
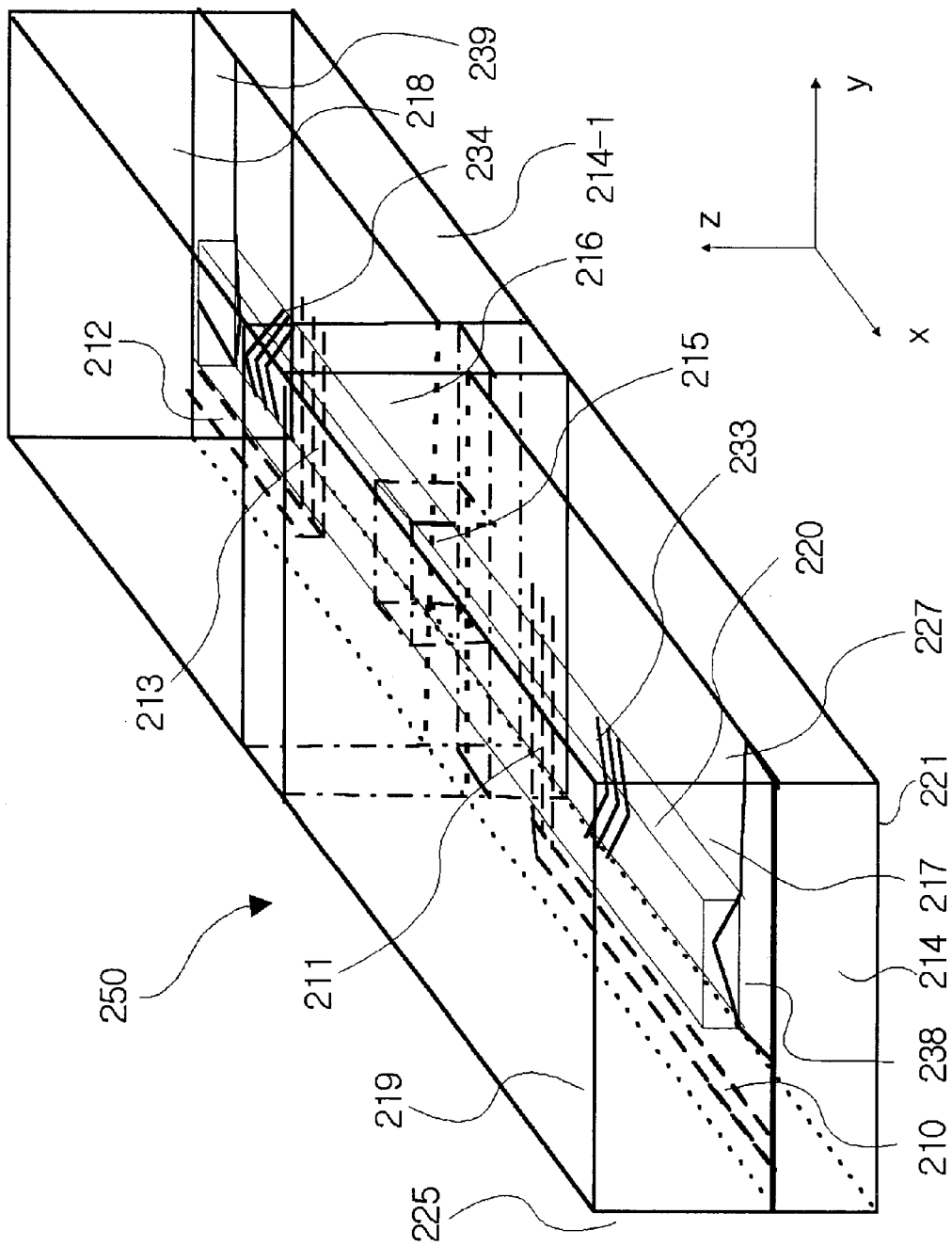
FIG. 4 shows a structure of a magnetostatic wave filter according to one embodiment of the present invention.

Referring now to FIG. 4, a magnetostatic wave filter according to one embodiment of the present invention will be below explained in detail.

The magnetostatic wave filter 250 shown in FIG. 4 includes transfer lines 210 of an input electrode and energy transformer lines (211, transducers), and transfer lines 212 of an output electrode and energy transformer lines 213, in low-loss dielectric substrates 214 and 214-1 having a lower plate ground face 221; and multi-layer ferromagnetic structure 220 of a magnetostatic wave medium on which a magnetically active ferromagnetic is formed on the input and output energy transformer lines 211 and 213, between shield films 215 and 216 between the input section and the output section.

Also, after low-loss dielectrics 217 and 218 are arranged between upper plate ground faces 219, if a constant magnetic field is applied to the x, y and z axes, respectively, a magnetostatic inverse volume wave, a magnetostatic surface wave or a magnetostatic net volume wave is generated depending on the circumstances. Then, it is propagated along the x axis direction, so that energy is transferred. The front and rear sides 225 and 227 of the magnetostatic wave filter can be shield by means of a conductor or can be open like a strip line. More particularly, in the inputted electromagnetic energy, in case that an external DC magnetic field is applied to the x axis direction from the input energy transformer line 211, the magnetostatic inverse volume wave is generated. If an external DC magnetic field is applied to the y axis direction from the input energy transformer line 211, the magnetostatic surface wave is generated. If an external DC magnetic field is applied to the z axis direction from the input energy transformer line 211, the magnetostatic net volume wave is generated is then propagated in the x direction. Then, it is reverse-transformed from the magnetostatic wave to the electromagnetic wave in the output energy transformer, so that energy can be transferred to an output transfer line.

Figure 1:
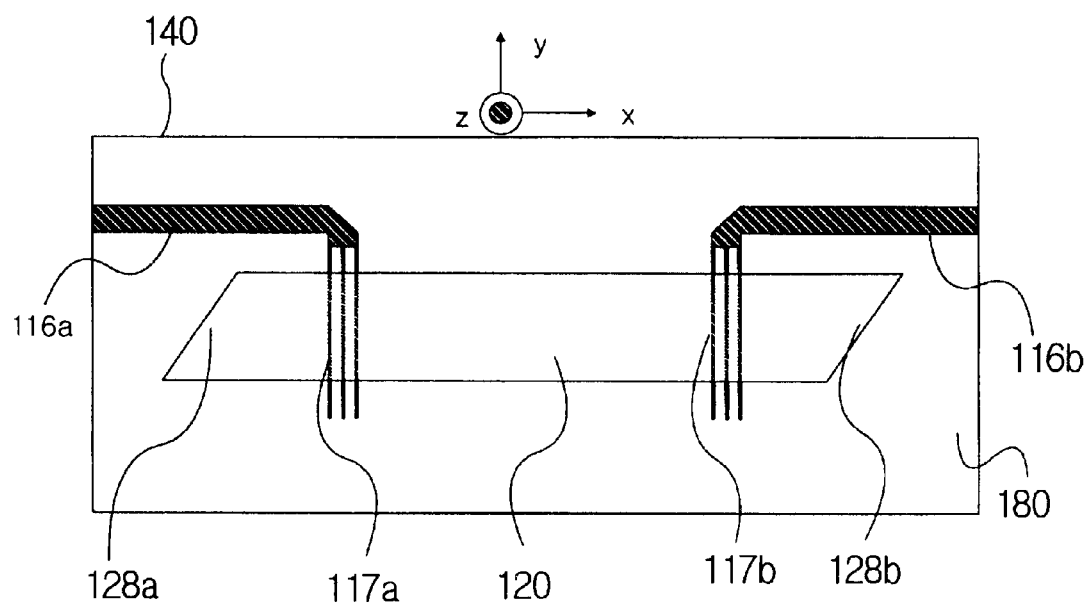
FIG. 1 is a plane view showing a structure of a conventional magnetostatic wave filter.
Figure 2:
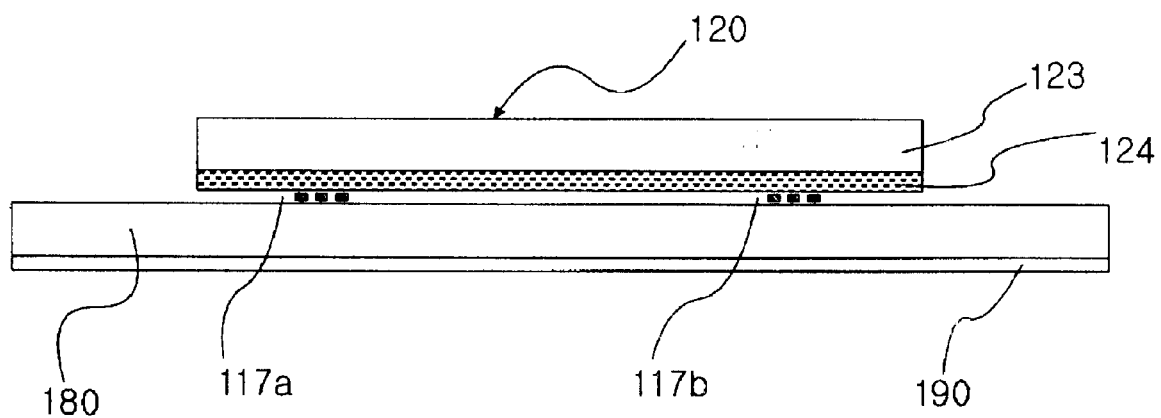
FIG. 2 is a front view showing a structure of the magnetostatic wave filter shown in FIG. 1.
Figure 3:
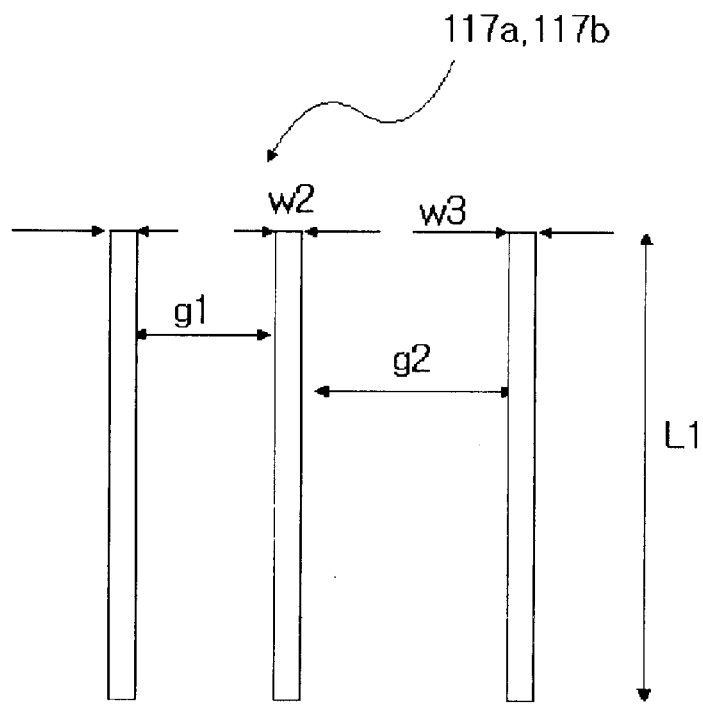
FIG. 3 shows the line structure of an input energy transformer 117a and an output energy transformer 117b, used in the conventional magnetostatic wave filter.
Figure 5:
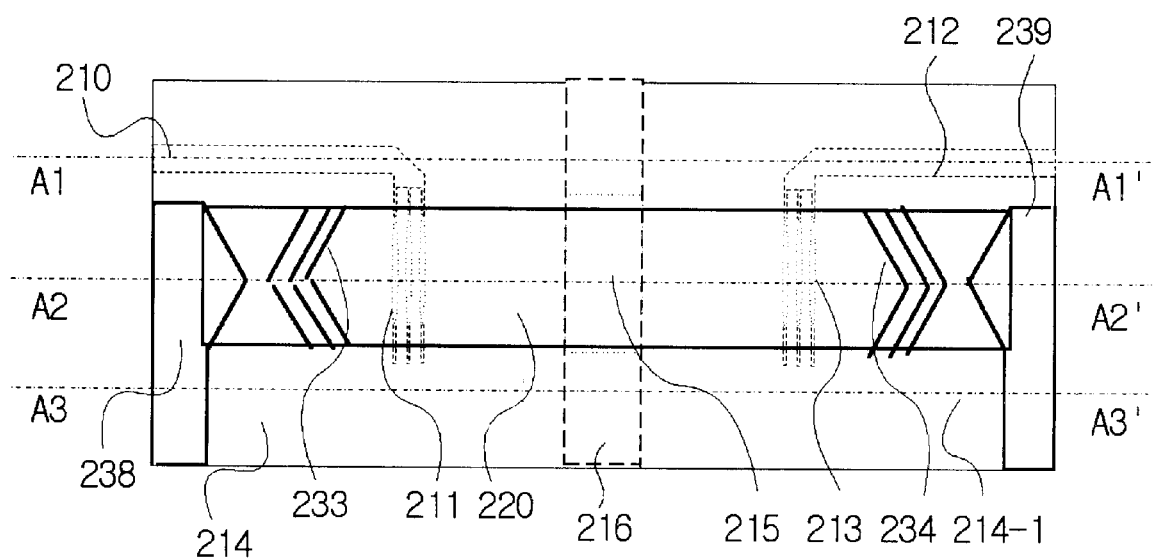
FIG. 5 is a horizontally taken plane view of the magnetostatic wave filter in FIG. 4.

Referring now to FIG. 5, a horizontally taken plane view of the magnetostatic wave filter shown in FIG. 4 will be explained in detail.

From the drawing, it can be seen that the input energy transformer line 211 and the output energy transformer line 213 are formed with multiple lines having variable width. Also, the shield film 216 including the air hole 215 forms a long waveguide centering around a portion into which the ferromagnetic multi-layer structure 220 is inserted. The air hole 215 is a passage through which the ferromagnetic multi-layer structure 220 passes through the shield film 216.

Figure 6A:
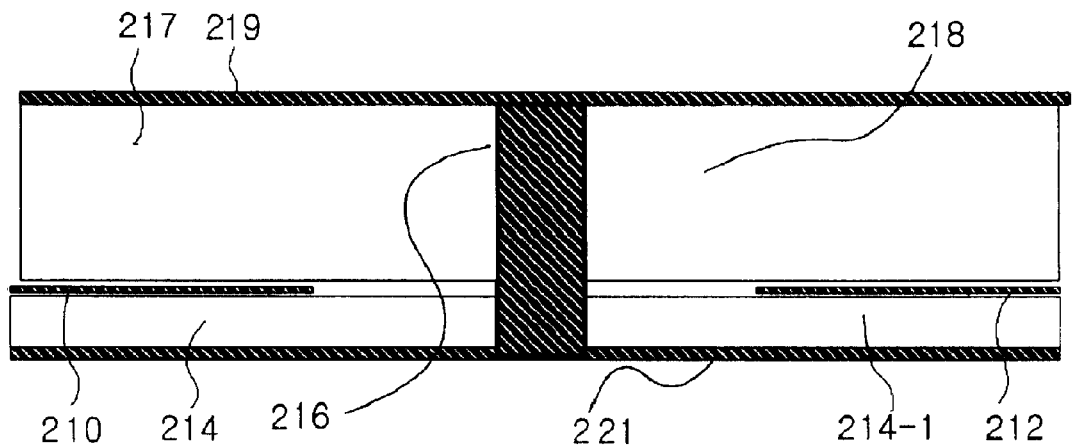
FIG. 6A is a cross-sectional view taken along A1–A1' in FIG. 5.
Figure 6B:
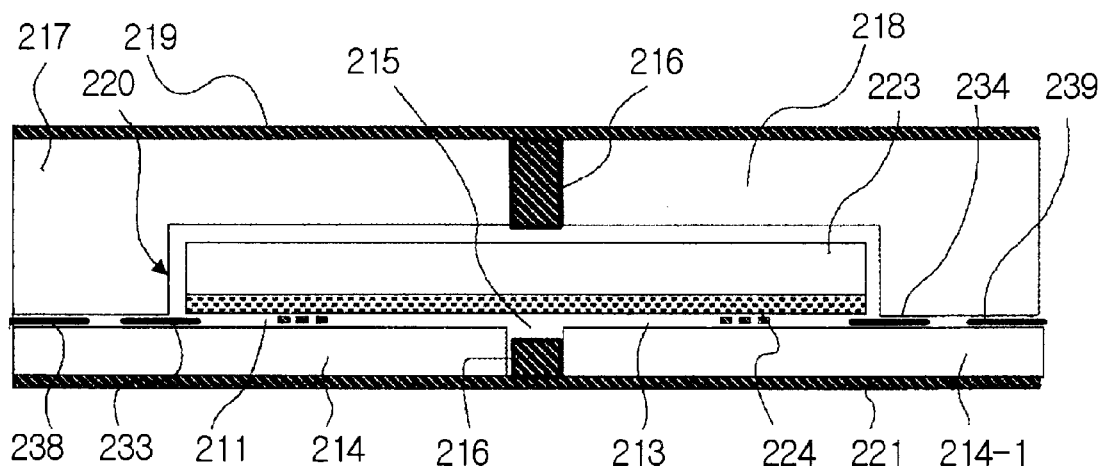
FIG. 6B is a cross-sectional view taken along A2–A2' in FIG. 5.
Figure 6C:
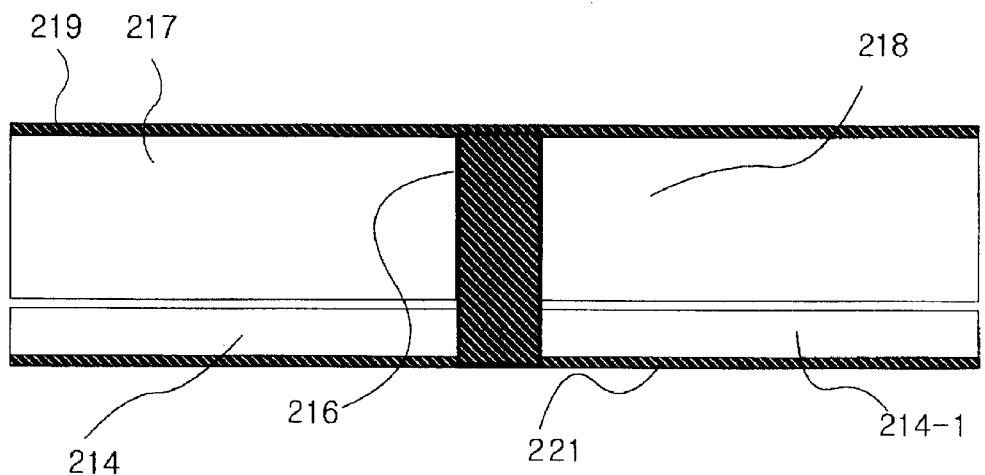
FIG. 6C is a cross-sectional view taken along A3–A3' in FIG. 5.

FIG. 6A is a cross-sectional view taken along A1–A1' in FIG. 5, FIG. 6B is a cross-sectional view taken along A2–A2' in FIG. 5 and FIG. 6C is a cross-sectional view taken along A3–A3' in FIG. 5.

The ferromagnetic multi-layer structure 220 passes through the air hole 215 that is an open area formed of the shield film 216. The electromagnetic energy inputted from the transfer line 210 of the input electrode is caused to generate an electromagnetic wave resonance due to the length of the energy transformer line 211. Also, the magnetostatic wave is generated in a given frequency band at the magnetized ferromagnetic formed in the ferromagnetic structure 220 magnetized in the resonant frequency band. Thus, the magnetostatic wave energy is transferred to the output transformer via the ferromagnetic positioned in the air hole 215 which is an open area formed of the wall side of a rectangular hole penetrated in the shield film 216 and the dielectric substrate or the ground structure.

Figure 7:
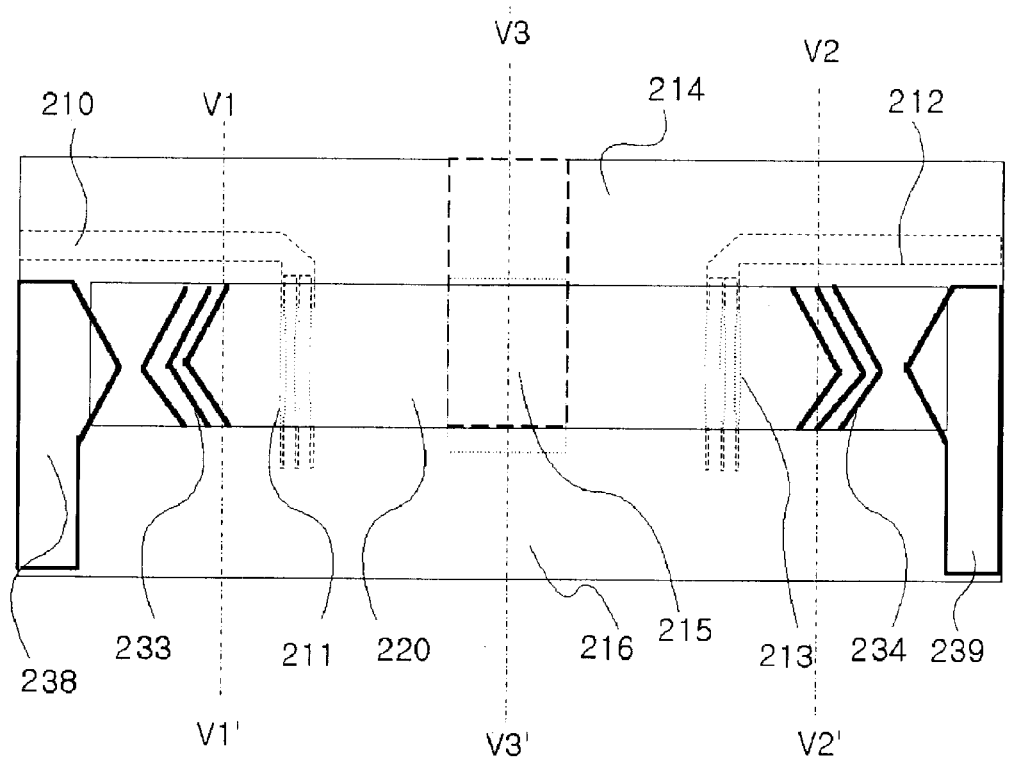
FIG. 7 is a vertically taken plane view of the magnetostatic wave filter in FIG. 4.
Figure 8A:
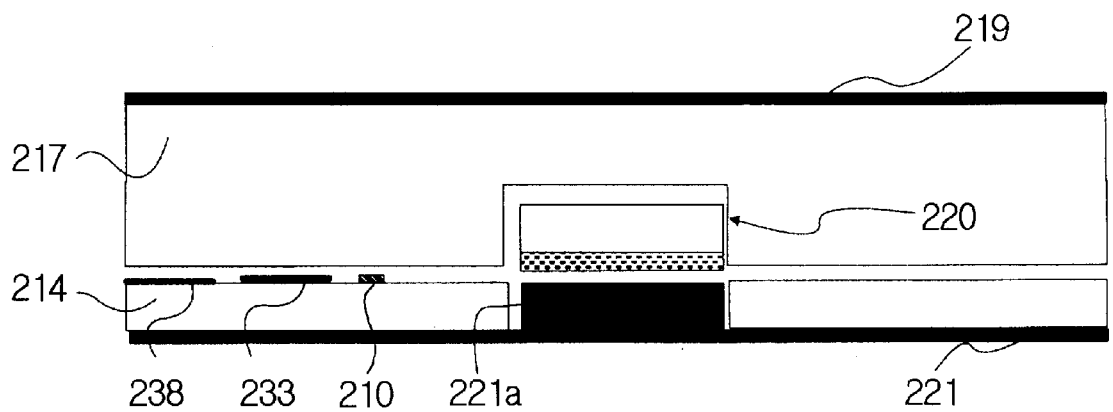
FIG. 8A is a cross-sectional view taken along V1–V1' in FIG. 7.
Figure 8B:
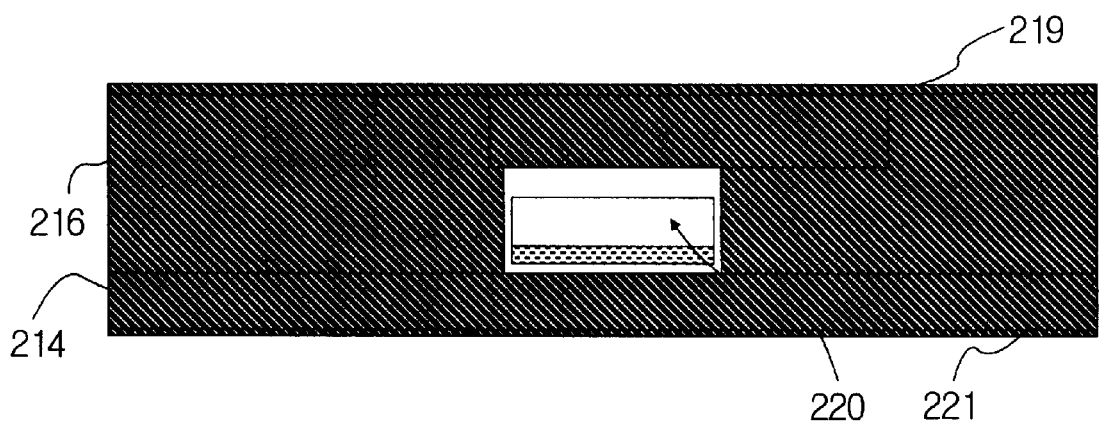
FIG. 8B is a cross-sectional view taken along V2–V2' in FIG. 7.
Figure 8C:
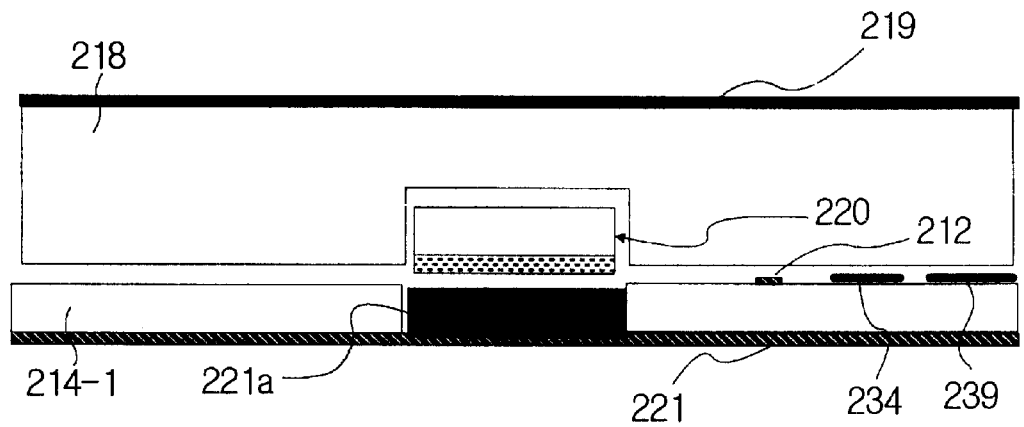
FIG. 8C is a cross-sectional view taken along V3–V3' in FIG. 7.

FIG. 7 is a vertically taken plane view of the magnetostatic wave filter shown in FIG. 4, FIG. 8A is a cross-sectional view taken along V1–V1' in FIG. 7, FIG. 8B is a cross-sectional view taken along V2–V2' in FIG. 7 and FIG. 8C is a cross-sectional view taken along V3–V3' in FIG. 7.

The open area through which the ferromagnetic multi-layer structure 220 passes has a shield frequency for not allowing an electromagnetic wave to pass. Thus, an electromagnetic wave being lower than the shield frequency could not pass through. The operating frequency of the magnetostatic wave filter lower than the shield frequency passes through the shield area via the magnetized ferromagnetic substance, so that energy can be transferred. The shield film 216 can reduce the electromagnetic wave coupling between the input section and the output section occurring outside the transfer band of the magnetostatic wave filter.

Figure 9:
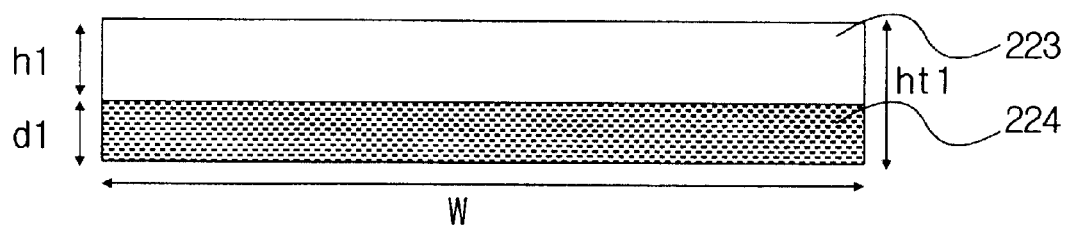
FIG. 9 is an enlarged view of a ferromagnetic multi-layer structure 220 shown in FIG. 4 that is a magnetostatic wave medium structure of a magnetostatic wave filter according to one embodiment of the present invention.

FIG. 9 is an enlarged view of a ferromagnetic multi-layer structure 220 shown in FIG. 4, which is a magnetostatic wave medium structure of a magnetostatic wave filter according to one embodiment of the present invention. From the drawing, it can be seen that the ferromagnetic substance 224 is formed on both sides of the magnetically active substrate 223. As the thickness dl of the ferromagnetic substance 224 is larger than that of the dielectric substrate 214, the bandwidth is broader.

Figure 10:
FIG. 10 shows a single transformation line in which the width of a transformation line used in one embodiment of the present invention changes toward the direction along which current flows.

FIG. 10 shows a single transformation line in which the width of a transformation line used in one embodiment of the present invention varies toward the direction along which current flows. From the drawing, it can be seen that the line is formed in a hexagonal shape. The variation in the width of the line changes the distribution of current so that the transfer characteristics are flat within the band.

Figure 11:
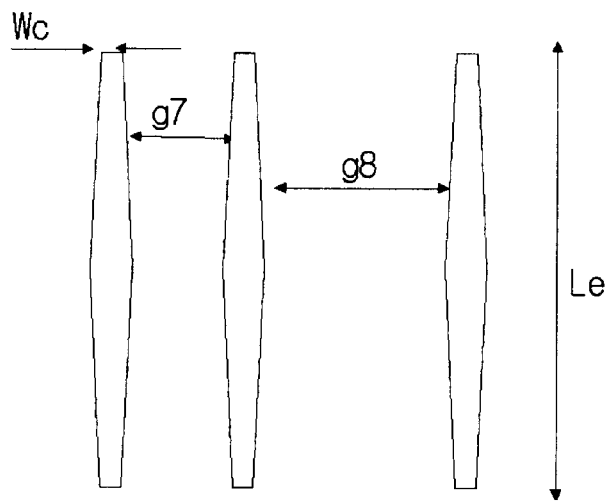
FIG. 11 shows an example in which lines used in FIG. 10 are applied in plural numbers.

FIG. 11 shows an example in which a plurality of lines used in FIG. 10 are used. Also, it can be seen that the line of a hexagonal shape is formed in plural numbers, i.e., multi bar. When this line is constituted, the distance between lines is varied to make uniform the selectivity for frequency in the generating frequency band, so that the transfer characteristics can be flat.

Figure 12:
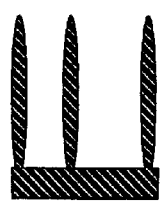
FIG. 12–FIG. 14 show examples constituting various shapes of transformation lines utilizing the transformation line shown in FIG. 10 and FIG. 11.
Figure 13:
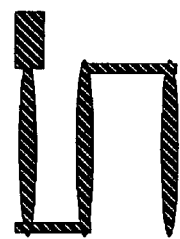
Figure 14:

FIG. 12~FIG. 14 show examples constituting various shapes of transformation lines utilizing the transformation line shown in FIG. 10 and FIG. 11. FIG. 12 shows the transformation line in which a line of a straight shape is added below the multi-bar shown in FIG. 11, FIG. 13 shows the line of a meander shape and FIG. 14 shows the line of an inter-digital shape.

Figure 15:
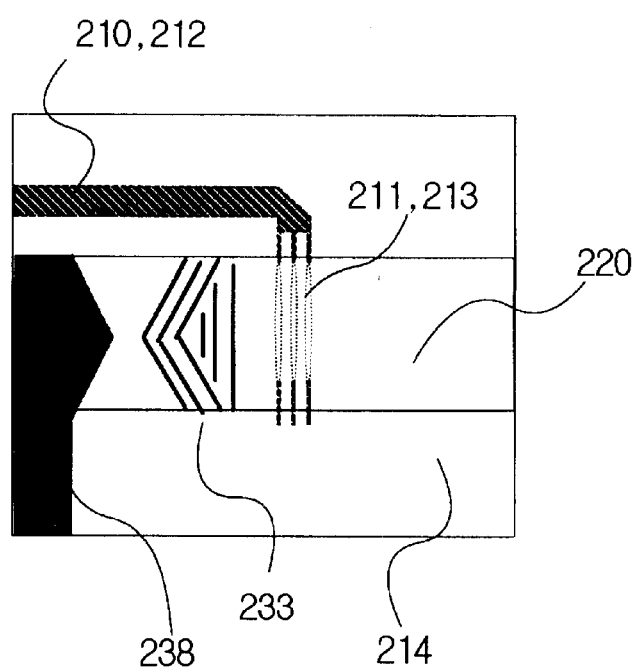
FIG. 15 is a schematic view of a magnetostatic end portion and a magnetostatic reflector according to one embodiment of the present invention.
Figure 16A:
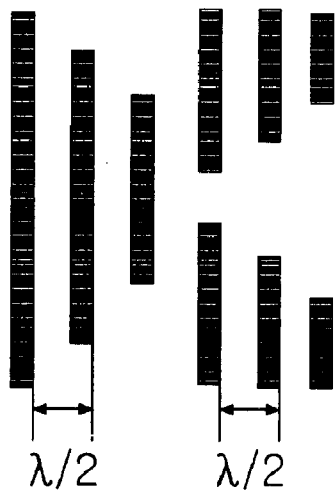
FIGS. 16A, 16B, 16C, and 16D show various shapes of the magnetostatic wave reflector 233 shown in FIG. 15.
Figure 16B:
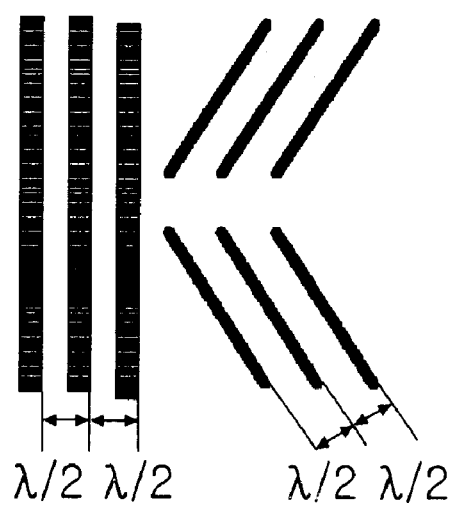
Figure 16C:
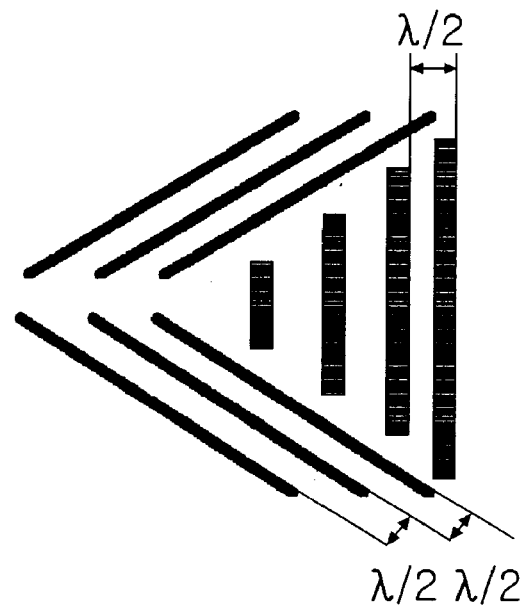
Figure 16D:
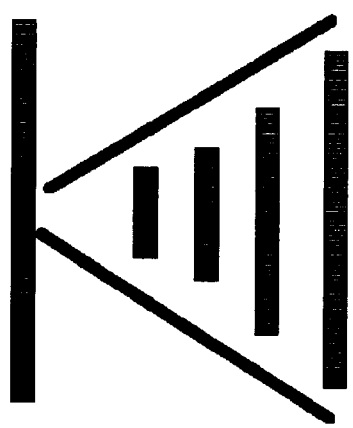

FIG. 15 is a schematic view of a magnetostatic end portion and a magnetostatic reflector according to one embodiment of the present invention.

There is installed a terminator 238, 239 for terminating a magneto static wave so that the magnetostatic wave reached at the end of the ferromagnetic substance could not be reflected, by inserting a conductor pattern into the dielectric substrate 214 so that it can be positioned at both sides of an end of the ferromagnetic substance. Also, a magnetostatic wave reflector 233, 234 comprising a plurality of lines disposed not on a ferromagnetic substrate but on a dielectric substrate 214, 214-1. The interval between each line corresponds to a half wavelength of the magnetostatic wave so that a desired frequency band can be reflected before reaching the terminator 238, 239 to select a pass-band.

FIGS. 16A, 16B, 16C, and 16D show various shapes of the magnetostatic wave reflector 233 shown in FIG. 15.

The distance between respective lines of the magnetostatic wave reflector 233 can be made different and the reflecting position can be occurred at various locations. Thus, the energy propagating in an opposite direction not absorbed in the transducer can be reflected so that it can be re-transformed in the magnetostatic wave transducer. FIGS. 16A, 16B, 16C, and 16D show various structures for increasing the efficiency of the magneto static wave reflector 233, respectively. Using reflectors having these structures, the insertion loss within the pass-band of the magnetostatic wave filter can be minimized.

From the drawing, it can be seen that the reflecting line of the reflector is separated in upper and lower portions or slanted against the direction of propagation, or the upper and lower portions are combined.

Figure 17:
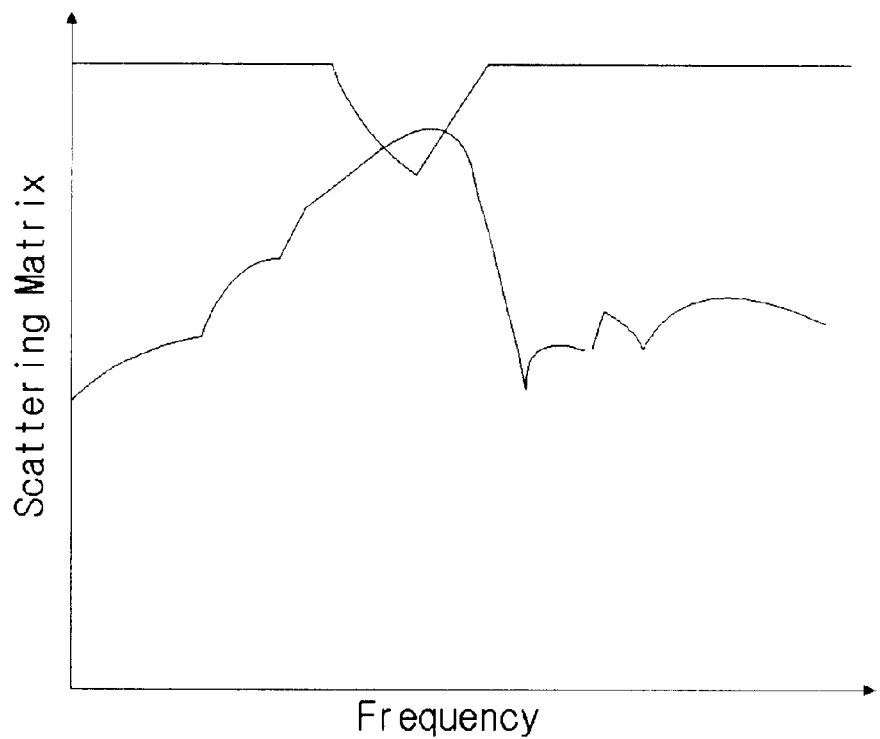
FIG. 17 shows a scattering matrix characteristic of a conventional magnetostatic wave filter.
Figure 18:
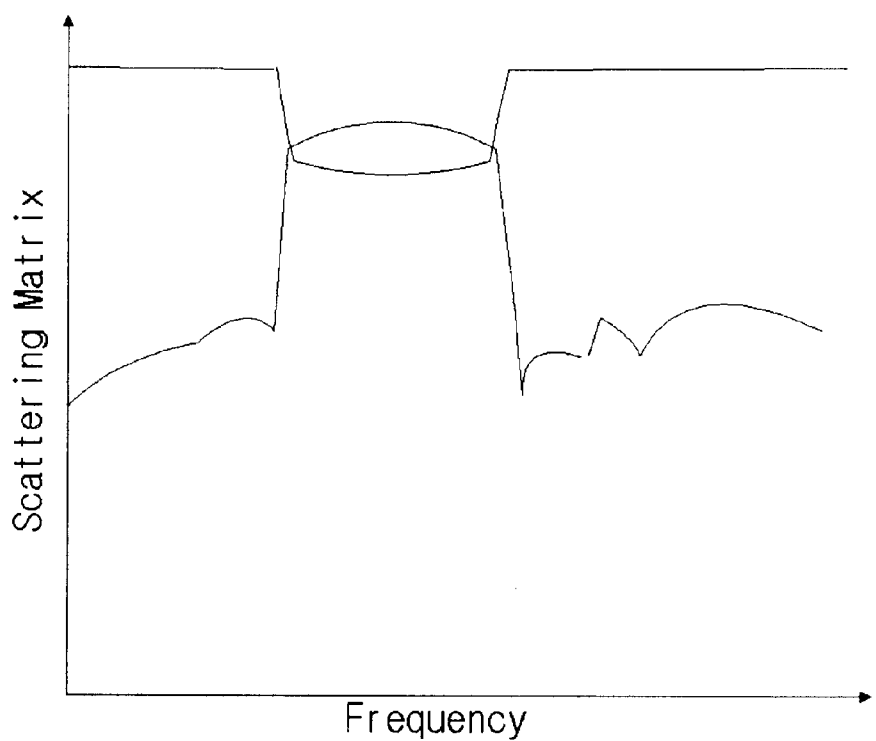
FIG. 18 shows a scattering matrix illustrating a characteristic in which a ripple within a band-pass of a magnetostatic wave filter according to one embodiment of the present invention is reduced.
Figure 19:
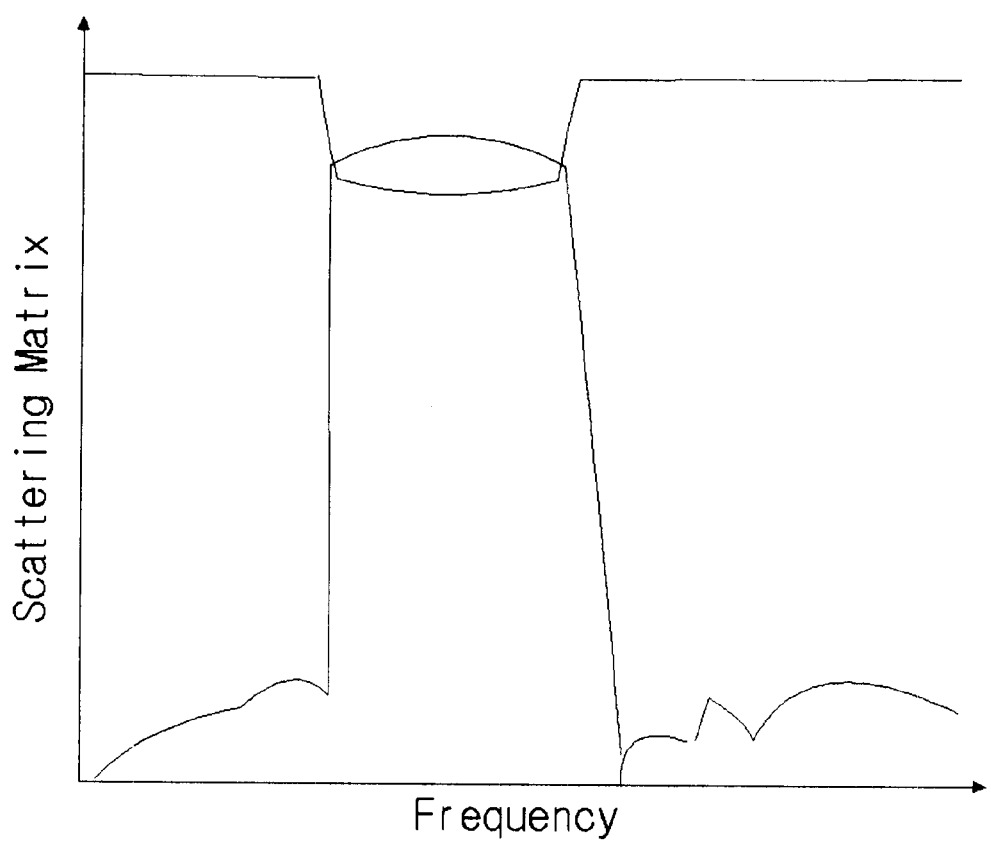
FIG. 19 shows a scattering matrix illustrating a characteristic in which an electromagnetic wave coupling between a ripple within a band-pass of a magnetostatic wave filter according to one embodiment of the present invention and an input/output is reduced.

FIG. 17~FIG. 19 show the scattering matrixes illustrating high frequency electrical characteristics of the magnetostatic wave filter according to one embodiment of the present invention.

FIG. 17 shows the scattering matrix characteristic of a conventional magnetostatic wave filter. It can be seen that a ripple within the pass-band is severe and the attenuation characteristic outside the band is poor.

FIG. 18 shows the characteristic of the magneto static wave filter obtained by means of the input/output energy transformer, and the reflector and the terminator, which is the subject matter of the present invention. From the drawing, it can be seen that a scattering matrix in which a ripple within the band-pass of the filter is reduced.

FIG. 19 shows a scattering matrix illustrating an effect of the shield film for reducing an electromagnetic wave coupling which is proposed by the present invention. It shows that the pass band and the region outside the pass band are separated in a greater degree. The transfer of energy of the input section and the output section is transformed into the magnetostatic wave and is then propagated between the holes of the shield film via the magnetic thin film, so that a direct electromagnetic coupling between the input and the output can be prevented.

As mentioned above, according to the present invention, a line shape in which the width of an exciting line varies in dimension along a longitudinal direction and a line shape in which the distance between neighboring lines varies in dimension along the longitudinal direction when multiple lines are used are respectively applied to an input electrode and an output electrode. Therefore, the present invention has outstanding effects that it can increase the transfer frequency bandwidth of a magnetostatic wave filter and also reduce the ripple.

Further, according to the present invention, the degree separation between the input section and the output section is increased by inserting a ground shield film through which only multiple ferromagnetic thin films can pass between the input section and the output section in the propagation direction. Also, radiation of energy is made small by forming a certain metal pattern around the exciting line of the input and output section to reduce the width of the line. Therefore, the present invention has outstanding effects that it can preclude transfer of energy in the frequency band outside the pass band of the filter and reduce loss of energy within the pass band using the magnetostatic wave reflector.

The present invention has been described with reference to a particular embodiment in connection with a particular application. Those having ordinary skill in the art and access to the teachings of the present invention will recognize additional modifications and applications within the scope thereof.

It is therefore intended by the appended claims and the equivalents thereof to cover any and all such applications, modifications, and embodiments within the scope of the present invention.

What is claimed:

1. A magneto static wave filter having a ferromagnetic substance stacked on one side of a dielectric substrate, one side of which is grounded, said filter including an input section having an input transfer line and an input energy transformer for causing the energy transformation between an electromagnetic wave and a magnetostatic wave, and an output section having an output energy transformer for causing the energy transformation between the electromagnetic wave and the magnetostatic wave and an output transfer line, being characterized in that:
   each exciting line in said input energy transformer and said output energy transformer having a width that varies in dimension along a longitudinal direction,
   the filter further includes a shield film formed of a grounded conductive film having holes through which a magnetic thin film can pass between said input section and said output section, for preventing coupling of an electromagnetic wave of said input section and said output section.

2. The magneto static wave filter according to claim 1, wherein the exciting line of said input energy transformer and said output energy transformer is a line of a hexagonal shape.

3. The magneto static wave filter according to claim 1, wherein the exciting line of said input energy transformer and said output energy transformer is a line of a multi bar shape.

4. The magnetostatic wave filter according to claim 1, wherein the exciting line of said input energy transformer and said output energy transformer is a line of a meander shape.

5. The magnetostatic wave filter according to claim 1, wherein the exciting line of said input energy transformer and said output energy transformer is a line of an interdigital shape.

6. The magnetostatic wave filter according to claim 1, further including a reflector for reflecting the energy passing through the input and output transformer into an opposite direction to reduce loss of the energy within the pass band.

7. The magnetostatic wave filter according to claim 6, wherein said reflector comprises a plurality of lines separated by intervals, and the intervals between the lines correspond to a half wavelength of the magnetostatic wave.

8. The magnetostatic wave filter according to claim 6, wherein said reflector has reflecting lines divided into an upper portion and a lower portion.

9. The magnetostatic wave filter according to claim 6, wherein said reflector has a reflecting line slanted with respect to the propagation direction.

10. The magnetostatic wave filter according to claim 6, wherein said reflector has a reflecting line that is divided into an upper portion and a lower portion and is also slanted with respect to the propagation direction.

11. The magnetostatic wave filter according to claim 1, further including a terminator functioning to terminate a magnetostatic wave so that the magnetostatic wave reached the end of the line is not reflected.

12. The magnetostatic wave filter according to claim 11, wherein said terminator is formed by inserting a conductor pattern into said dielectric substrate so that said conductor pattern can be positioned at both ends of said ferromagnetic substance.

13. The magnetostatic wave filter according to claim 1, wherein said electromagnetic substance is a ferromagnetic substance.

14. A magnetostatic wave filter having an input section and an output section is characterized in that:
   said input section includes,
      an input transfer line for performing a transfer line function of an electromagnetic wave energy; and
      an input energy transformer (transducer) consisting of a single line or multiple lines, each line having a width, the width varying in dimension along a longitudinal direction in order to transform the energy between an electromagnetic wave and a magnetostatic wave using a signal received from said input transfer line,
   said output section includes,
      an output energy transformer consisting of a single line or multiple lines, each line having a width, the width varying in dimension along a longitudinal direction in order to transform the energy between an electromagnetic wave and a magnetostatic wave; and
      an output transfer line for receiving the transformed electromagnetic wave from said output energy transformer to perform a transfer line function, and
   the filter further includes a shield film formed of a grounded conductive film having holes through which a magnetic thin film can pass between said input section and said output section, for preventing coupling of an electromagnetic wave of said input section and said output section.

15. The magnetostatic wave filter according to claim 14, wherein the exciting line of said input energy transformer and said output energy transformer is a line of a hexagonal shape.

16. The magnetostatic wave filter according to claim 14, wherein the exciting line of said input energy transformer and said output energy transformer is a line of a multi bar shape.

17. The magnetostatic wave filter according to claim 14, wherein the exciting line of said input energy transformer and said output energy transformer is a line of a meander shape.

18. The magnetostatic wave filter according to claim 14, wherein the exciting line of said input energy transformer and said output energy transformer is a line of an interdigital shape.

19. The magnetostatic wave filter according to claim 14, further including a reflector for reflecting the energy passing through the input and output transformer into an opposite direction to reduce loss of the energy within the pass band.

20. The magnetostatic wave filter according to claim 14, further including a terminator functioning to terminate a magnetostatic wave so that the magnetostatic wave reached the end of the line is not reflected.

* * * * *